(12) United States Patent
Gontowski, Jr.

(10) Patent No.: US 6,954,105 B2
(45) Date of Patent: Oct. 11, 2005

(54) DISK DRIVE AND ERROR AMPLIFIER THEREFOR AND RELATED METHODS

(75) Inventor: Walter Stanley Gontowski, Jr., Prescott, AZ (US)

(73) Assignee: STMicroelectronics, Inc., Carrollton, TX (US)

(*) Notice: Subject to any disclaimer, the term of this patent is extended or adjusted under 35 U.S.C. 154(b) by 478 days.

(21) Appl. No.: 10/285,006

(22) Filed: Oct. 31, 2002

(65) Prior Publication Data

US 2004/0085871 A1 May 6, 2004

(51) Int. Cl.[7] ................................................. H03F 3/26
(52) U.S. Cl. ...................... 330/267; 330/296; 330/135; 360/78.12
(58) Field of Search ............................... 330/267, 296, 330/135; 360/78.12

(56) References Cited

U.S. PATENT DOCUMENTS

| 5,521,553 | A | * | 5/1996 | Butler ........................ 330/265 |
| 5,548,205 | A | * | 8/1996 | Monticelli ................. 323/274 |
| 5,663,673 | A | * | 9/1997 | Tanaka et al. ............. 327/412 |
| 5,877,914 | A | | 3/1999 | Gontowski, Jr. ......... 360/78.12 |
| 6,151,186 | A | | 11/2000 | O'Farrell ................. 360/78.04 |
| 6,229,273 | B1 | | 5/2001 | Kelly et al. ................. 318/254 |
| 6,456,326 | B2 | * | 9/2002 | Fossum et al. ............. 348/308 |
| 6,586,998 | B2 | * | 7/2003 | Moraveji .................... 330/267 |

* cited by examiner

*Primary Examiner*—Patricia Nguyen
(74) *Attorney, Agent, or Firm*—Lisa K. Jorgenson; Christopher F. Regan

(57) ABSTRACT

An amplifier may include an output stage including first and second output transistors, and a biasing stage for generating first and second biasing voltages at control terminals of the first and second output transistors, respectively, based upon a supply voltage and an input signal of the amplifier. The amplifier may also include a clamping stage having first and second clamping transistors for clamping outputs of the first and second output transistors to upper and lower clamping voltages, respectively. Additionally, the amplifier may also advantageously include a saturation detector connected to the clamping stage for providing a saturation signal for at least one of (a) the output of the first output transistor being clamped to the upper clamping voltage, and (b) the output of the second output transistor being clamped to the lower clamping voltage.

34 Claims, 3 Drawing Sheets

DISK DRIVE AND ERROR AMPLIFIER THEREFOR AND RELATED METHODS

FIELD OF THE INVENTION

The present invention relates to the field of electronic circuits, and, more particularly, to operational amplifiers, such as those used in disk drives, for example, and related methods.

BACKGROUND OF THE INVENTION

Disk drives, such as hard disk drives, floppy disk drives, CD-ROM drives, etc., are widely used in computers and other devices for data storage. Such disk drives typically include a magnetic or optical disk upon which data is stored. Data is read from and/or written to the disk by a magnetic or optical read/write head (or heads) that is movable with respect to the disk and is positioned by a motor based upon positioning information provided by the computer.

One common motor used in disk drives includes a "voice coil" that serves as an actuator to move and position the read/write heads. The name voice coil comes from the similarity of such coils to those commonly used in audio loudspeaker systems. That is, such voice coils are operated in a manner similar to acoustic voice coils in that a positive current applied to the coil produces a corresponding positive direction of motion of the read/write head, and a negative current applied to the voice coil produces a corresponding negative displacement of the read/write head.

Because of the high degree of accuracy and extremely fast speeds required of disk drives, high precision components are typically used in such drives. For the same reasons, it is also typically necessary to determine any error or deviation in the drive current of the voice coil. This error may then be used by the driving stage for the motor to make the appropriate adjustments as necessary to ensure that proper positioning of the read/write head is maintained at all times. Such error signal may be generated using an operational amplifier connected in a feedback loop from the voice coil to a driving stage of the motor, for example.

When designing such control feedback loops, it may be desirable to achieve a fast transient response so that none of the active elements in the control loop enter saturation. This may be especially true for the driving stage of a voice coil. Once an amplifier or driving stage becomes saturated, response time may be severely affected due to the delay required to get out of saturation.

To prevent such operational amplifiers and driver stages from saturating, it may be necessary to limit the swing of input and/or output signals thereof. One prior art error detection circuit 100 for use with a voice coil motor which provides output signal clamping is now described with reference to FIG. 3. The circuit 100 includes an error amplifier 101, which is a typical operational amplifier configured as an inverting amplifier having a gain of 10 by way of the resistors 102 (having a value of 10R) and 103 (having a value of R). The error amplifier 101 is used to determine the voltage difference between a known reference or control signal and a feedback signal from the voice coil feedback loop that provides information about the voice coil motor current. The difference in voltage between these two signals is the error signal. This error signal is used to control the conduction of the output drivers to control the voice coil current.

In an effort to ensure that the output stage of the error amplifier 101 does not saturate, the output is clamped to define the upper and lower boundaries of the output voltage. To this end, four diodes 103–106 are connected in the error amplifier 101 feedback loop to limit or clamp the output swing. In operation, if the output of the error amplifier 101 is driven high, both diodes 103 and 104 conduct when the output voltage exceeds two diode drops (approximately 1.4 V) above the reference voltage potential, or 5 V in this example. Similarly, if the output of the error amplifier 101 is driven low, both diodes 105 and 106 conduct when the output voltage becomes two diode drops lower than the reference voltage.

While the error amplifier 101 and diode 103–106 clamping stage therefor is effective, there are still some drawbacks. For example, the clamping voltage can only be selected in multiples of diode drops. Moreover, the diodes exhibit a negative temperature coefficient affecting the accuracy of the clamp voltage with temperature. Another drawback is that the absolute value of the clamp voltage is a function of the processing of the diode drops, which decreases in accuracy as the number of diodes is increased.

Another example of an amplifier which includes a clamping circuit and that does not suffer from the above-noted drawbacks is disclosed in U.S. Pat. No. 5,877,914 to Gontowski, Jr., assigned STMicroelectronics, Inc., assignee of the present invention, and which is hereby incorporated herein in its entirety by reference. The output stage of this amplifier, which operates in class AB, includes two source and the sink bipolar transistors which are serially connected between a power supply and a ground terminal. The serial connection between the emitter of the first transistor and the collector of the second transistor provides the output terminal of the output stage. Furthermore, the base terminals of the two output transistors are connected to a bias circuit and to an input transistor, which is used as the signal control element. The clamping circuit is directly connected with the base terminals of the output transistors to limit the voltage on the base terminals between a first and a second clamping voltage references.

Turning again to the error detection circuit 100 of FIG. 3, in some circumstances it may be beneficial to know when the error amplifier 101 is being driven toward positive or negative saturation. To this end, the error detection circuit 101 also includes a pair of operational amplifiers 107, 108 which are used to compare the output of the error amplifier with an internally generated reference voltage Vref. In particular, the amplifier 107 toggles high when the output of the error amplifier 101 saturates high, while the amplifier 108 toggles high when the output of the error amplifier saturates low. The outputs of the error amplifiers 107, 108 are connected via diodes 109, 110 to a first terminal of a resistor 111, a second terminal of which is connected to ground. The saturation signal is provided at the first terminal of the resistor 111.

While it may advantageously provide saturation detection, the error detection circuit 100 still suffers the above-noted drawbacks, which may render it unsuitable for certain applications. Moreover, the voltage tracking between the clamping diodes and the reference for the saturation detector, both in terms of absolute value and temperature dependency, may be less than desirable in some applications.

SUMMARY OF THE INVENTION

In view of the foregoing background, it is therefore an object of the present invention to provide an amplifier, such as for a disk drive, with enhanced clamping and saturation detection features.

This and other objects, features, and advantages in accordance with the present invention are provided by an amplifier including an output stage (e.g., a Class AB output stage) which may include first and second output transistors. The first output transistor may have a first conduction terminal connected to a supply voltage, a second conduction terminal, and a control terminal. Further, the second output transistor may have a first conduction terminal connected to the second conduction terminal of the first output transistor and defining an output of the amplifier, a second conduction terminal connected to a reference voltage, and a control terminal. The amplifier may further include a biasing stage for generating first and second biasing voltages at the control terminals of the first and second output transistors, respectively, based upon the supply voltage and an input signal of the amplifier.

In addition, the amplifier may also include a clamping stage including a first clamping transistor having a first conduction terminal connected to the control terminal of the first output transistor, a second conduction terminal connected to the reference voltage, and a control terminal connected to an upper clamping voltage. The first clamping transistor thus clamps an output of the first output transistor to the upper clamping voltage. The clamping stage may additionally include a second clamping transistor having a first conduction terminal connected to the supply voltage, a second conduction terminal connected to the control terminal of the second output transistor, and a control terminal connected to a lower clamping voltage. The second clamping transistor thus clamps an output of the second output transistor to the lower clamping voltage.

The amplifier may also advantageously include a saturation detector connected to the clamping stage. The saturation detector may provide a saturation signal for at least one of (a) the output of the first output transistor being clamped to the upper clamping voltage, and (b) the output of the second output transistor being clamped to the lower clamping voltage. More particularly, the saturation detector may include a saturation reference current source connected to the supply voltage, and a saturation detection transistor having a first conduction terminal connected to the saturation reference current source, a second conduction terminal connected to the second conduction terminal of the first clamping transistor, and a control terminal connected to the first conduction terminal of the second clamping transistor.

Furthermore, the saturation detector may also include a first resistor connected between the second conduction terminal of the saturation detection transistor and the reference voltage. A second resistor may be connected between the supply voltage and the control terminal of the saturation detection transistor as well. The saturation detector may provide the saturation signal at the second conduction terminal of the saturation detection transistor. The amplifier may thus provide desired voltage tracking between the clamping stage and the saturation detector both in terms of absolute value and temperature dependency.

The biasing stage may include a biasing current source connected to the supply voltage, and an input transistor having a first conduction terminal connected to the biasing current source, a second conduction terminal connected to the reference voltage, and a control terminal connected to the input signal of the amplifier. Further, the biasing stage may also include at least one diode connected between the biasing current source and the first conduction terminal of the input transistor.

Additionally, the clamping stage may further include a clamping reference current source connected to the supply voltage, and first and second resistors series-connected between the clamping reference current source and the reference voltage. The first clamping voltage may be provided between the clamping reference current source and the first resistor, and the second clamping voltage may be provided between the first resistor and the second resistor. By way of example, the first and second output transistors, the first and second clamping transistors, and the saturation detection transistor may all be bipolar junction transistors (BJTs).

A disk drive is also provided in accordance with the present invention and may include a data storage disk, a head for at least one of reading data from and writing data to the data storage disk, a motor for positioning the head adjacent the data storage disk, and a driving stage for generating a driving current for the motor. By way of example, the motor may be a voice coil motor. Furthermore, the disk drive may also advantageously include an error amplifier, such as the amplifier described briefly above, which advantageously provides clamping of the error signal, as well as saturation detection.

A method aspect of the invention is for detecting saturation of an amplifier, such as the one briefly described above. The method may include defining respective first and second biasing voltages at control terminals of the first and second output transistors using the biasing stage. Additionally, the output of the first output transistor may be selectively clamped to an upper clamping voltage using a first clamping transistor having a first conduction terminal connected to the control terminal of the first output transistor, a second conduction terminal connected to the reference voltage, and a control terminal connected to the upper clamping voltage.

Moreover, the output of the second output transistor may be selectively clamped to a lower clamping voltage using a second clamping transistor having a first conduction terminal connected to the supply voltage, a second conduction terminal connected to the control terminal of the second output transistor, and a control terminal connected to the lower clamping voltage. The method may also advantageously include providing a saturation signal for at least one of (a) the output of the first output transistor being clamped to the upper clamping voltage, and (b) the output of the second output transistor being clamped to the lower clamping voltage.

DETAILED DESCRIPTION OF THE PREFERRED EMBODIMENTS

The present invention will now be described more fully hereinafter with reference to the accompanying drawings, in which preferred embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Like numbers refer to like elements throughout.

Figure 1:
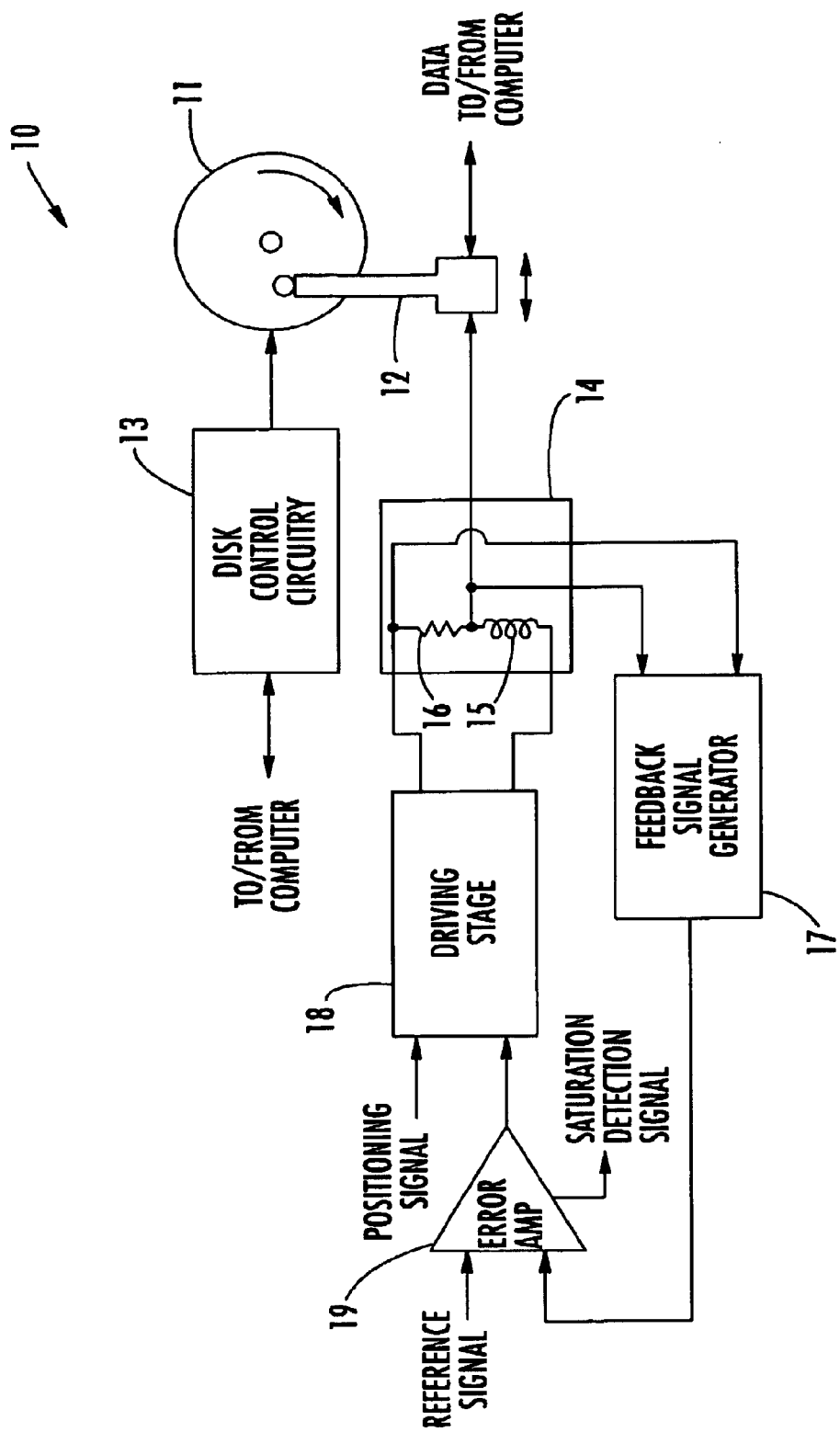
FIG. 1 is a schematic block diagram of a disk drive in accordance with the present invention.

Referring initially to FIG. 1, a disk drive 10 in accordance with the present invention illustratively includes a data storage disk 11, such as a magnetic or optical disk, and one or more heads 12 for reading data from and/or writing data to the data storage disk, as will be appreciated by those skilled in the art. It will also be appreciated that disk control circuitry 13 may optionally be included in some embodiments for controlling the speed of rotation of the data storage disk 11, for example, based upon control signals from a computer or other device with which the disk drive 10 is associated.

The disk drive 10 further includes a motor 14 for positioning the head 12 adjacent the data storage disk at the appropriate location. The motor 14 illustratively includes a voice coil 15 for actuating the head 12, although other suitable motors may also be used. As noted above, it is typically advantageous with such motors to generate a feedback signal corresponding to the current in the voice coil 15. This current is determined by measuring the voltage drop across a sense resistor 16, and such measurement is provided to a feedback signal generator 17 for generating the feedback signal. The feedback signal generator 17 may be implemented using an operational amplifier, for example, as will readily be appreciated by those skilled in the art.

The disk drive further illustratively includes a driving stage 18 for the motor 14. While the driving stage 18 and motor 14 are illustratively shown as being separate for clarity of illustration, it will be appreciated that in some embodiments the driving stage may be included within the motor, for example. In either case, the driving stage 18 generates positive and negative driving currents for the voice coil 15. Various driving stage and motor configurations may be used and are contemplated by the present invention, as will be understood by those skilled in the art.

The driving stage 18 generates the positive and negative driving currents based upon a positioning signal and an error signal. The positioning signal may be generated by a servo controller (not shown) connected to the computer or other device with which the disk drive 10 is associated, for example. The error signal is generated by an error amplifier 19 which receives as inputs the feedback signal from the feedback signal generator 17 and a reference signal (e.g., a reference voltage).

Figure 2:
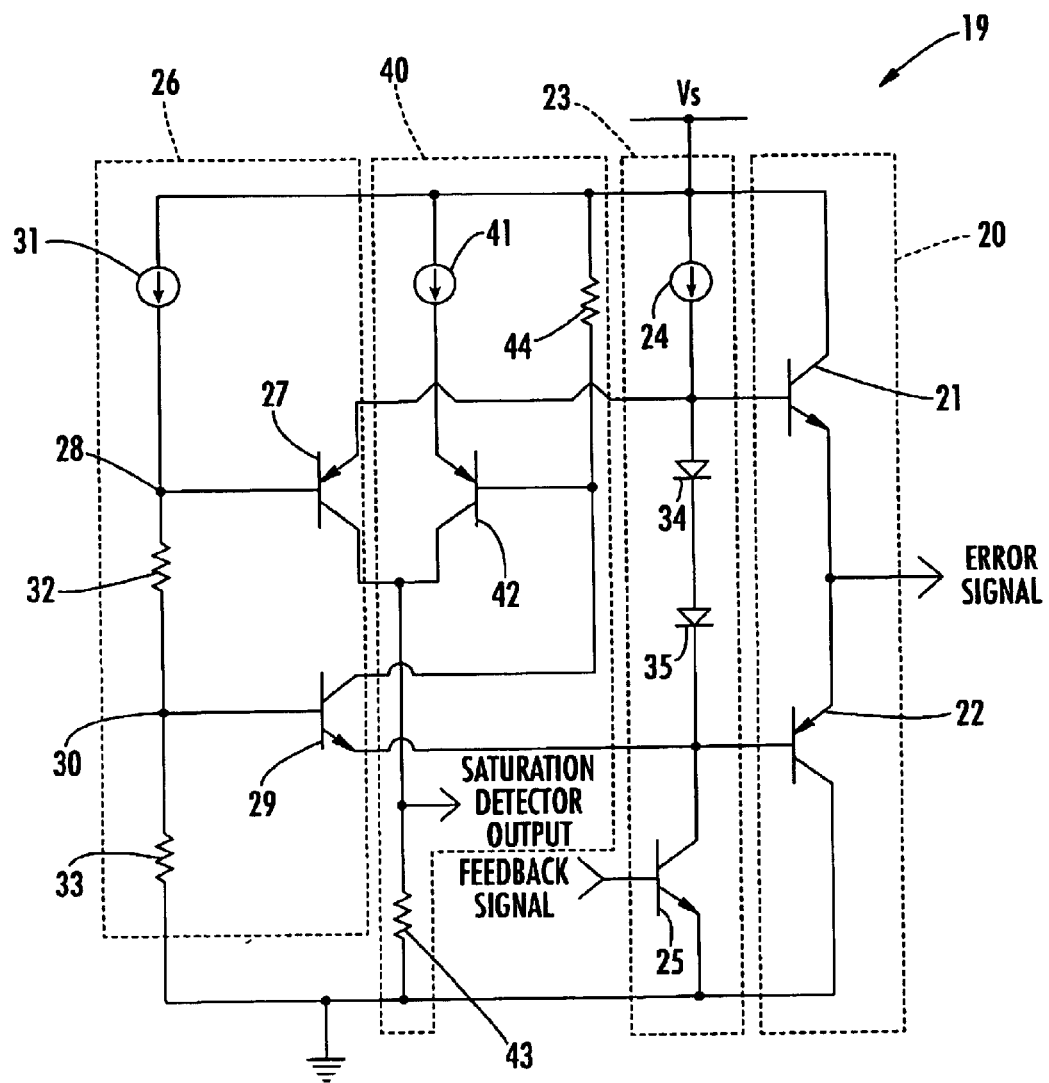
FIG. 2 is schematic circuit diagram illustrating in greater detail the error amplifier of the disk drive of FIG. 1.
Figure 3:
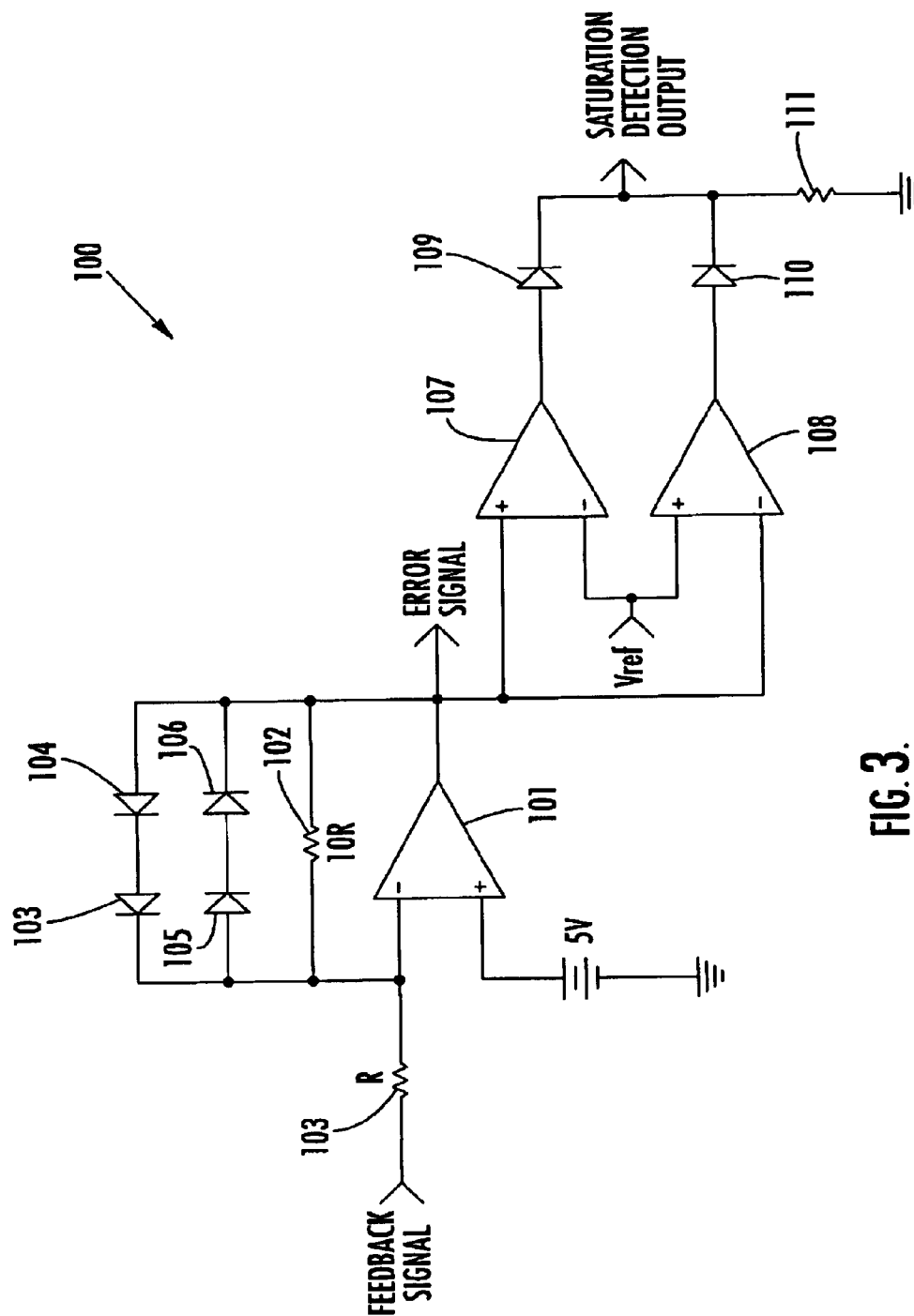
FIG. 3 is a schematic block diagram of a prior art error detection amplifier circuit.

Turning now additionally to FIG. 2, the error amplifier 19 will now be described in greater detail. The error amplifier 19 illustratively includes an output stage 20, which may be a Class AB output stage, for example. More particularly, the output stage 20 illustratively includes first and second output transistors 21, 22. The first output transistor 21 has a first conduction terminal connected to a supply voltage Vs, a second conduction terminal, and a control terminal. The second output transistor 22 has a first conduction terminal connected to the second conduction terminal of the first output transistor 21 to define an output of the amplifier 19, which provides the error signal. A second conduction terminal of the second output transistor 22 is connected to a reference voltage (i.e., ground in the illustrated example), and the second output transistor 22 also has a control terminal.

The error amplifier 19 further illustratively includes a biasing stage 23 for generating first and second biasing voltages at the control terminals of the first and second output transistors 21, 22, respectively, based upon the supply voltage Vs and an input signal. In the illustrated embodiment, the feedback signal is from the feedback signal generator 17 (FIG. 1), and the reference signal for the error amplifier 19 is the supply voltage Vs. More particularly, the biasing stage 23 illustratively includes a biasing current source 24 connected to the supply voltage Vs, and an input transistor 25 having a first conduction terminal connected to the biasing current source via a pair of diodes 34, 35, a second conduction terminal connected to ground, and a control terminal connected to the feedback signal.

The error amplifier 19 also advantageously includes a clamping stage 26. In particular, the clamping stage 26 illustratively includes a first clamping transistor 27 having a first conduction terminal connected to the control terminal of the first output transistor 21, a second conduction terminal connected to ground, and a control terminal connected to an upper clamping voltage provided at a node 28. A second clamping transistor 29 has a first conduction terminal connected to the supply voltage Vs, a second conduction terminal connected to the control terminal of the second output transistor 22, and a control terminal connected to a lower clamping voltage provided at a node 30.

It will therefore be appreciated by those skilled in the art that the first clamping transistor 27 clamps the output of the first output transistor 21 to the upper clamping voltage, and the second clamping transistor 29 clamps the output of the second output transistor 22 to the lower clamping voltage. To develop the upper and lower clamping voltages, the clamping stage 26 illustratively includes a clamping reference current source 31 connected to the supply voltage Vs, and first and second resistors 32, 33 series-connected between the clamping reference current source and ground. That is, the clamping reference current source 31 and the first resistor 32 are connected together at the node 28, while the first resistor 32 and second resistor 33 are connected together at the node 30.

The error amplifier 19 as thus far described is set forth in greater detail in U.S. Pat. No. 5,877,914 to Gontowski, Jr., discussed briefly above. Further advantages and features of the above-described amplifier stages may be found in the '914 patent.

In accordance with the present invention, the error amplifier 19 also advantageously includes a saturation detector 40 connected to the clamping stage 26. The saturation detector 40 is for providing a saturation signal for at least one of (a) the output of the first output transistor 21 being clamped to the upper clamping voltage, and (b) the output of the second output transistor 22 being clamped to the lower clamping voltage. In the illustrated embodiment, the saturation detector 40 will advantageously provide the saturation signal indicating when either one of the outputs of the first and second output transistors 21, 22 is clamped. In other embodiments, only the high or low clamping may be sensed for the saturation detection.

More particularly, the saturation detector 40 illustratively includes a saturation reference current source 41 connected to the supply voltage Vs. Furthermore a saturation detection transistor 42 has a first conduction terminal connected to the saturation reference current source 41, a second conduction terminal connected to the second conduction terminal of the first clamping transistor 27, and a control terminal connected to the first conduction terminal of the second clamping transistor 29.

Furthermore, the saturation detector 40 also illustratively includes a first resistor 43 connected between the second conduction terminal of the saturation detection transistor 42 and ground. A second resistor 44 is connected between the supply voltage Vs and the control terminal of the saturation detection transistor 42 as well. The saturation detector 40 provides the saturation signal at the second conduction terminal of the saturation detection transistor 42, as illustratively shown.

In operation, if the output of the error amplifier 19 would otherwise saturate on the high or positive side, the first clamping transistor 27 turns on, thus clamping the output of the first output transistor 21 to the level of the upper clamping voltage at the node 28. When the first clamping transistor 27 turns on, current flows into the resistor 43 from the biasing current generator 24, providing a voltage level determined by the values of the resistor 43 and the current from the biasing current generator. It will thus be appreciated that the voltage level of the saturation signal can be set to be compatible with a particular logic level being used in a given application based upon the selection of the resistor 43 and biasing current generator 24.

Conversely, if the output of the error amplifier 19 would otherwise saturate on the low or negative side, the second clamping transistor 29 turns on, which thus turns on the saturation detection transistor 42. The current flowing through the saturation detection transistor 42 is essentially set by the saturation reference current source 41, as will be appreciated by those skilled in the art. As such, the saturation reference current source 41 may be selected to provide substantially the same current as the biasing current source 24 so that the same value is provided for the saturation signal as when the first clamping transistor 27 turns on (e.g., a logic 1 value).

In the illustrated embodiment, the first and second output transistors 21, 22, the first and second clamping transistors 27, 29, the saturation detection transistor 42, and the input transistor 25 are all bipolar junction transistors (BJTs). It will be appreciated that other transistors, such as metal oxide semiconductor field-effect transistors (MOSFETs) or other suitable devices, may be used in other embodiments. Moreover, various resistor and current source values may also be selected based upon the given application and logic values to be used, as will be appreciated by those skilled in the art.

It will be also appreciated by those skilled in the art that the above-described saturation detector 40 provides improved voltage tracking between the clamping stage 26 and the saturation detector both in terms of absolute value and temperature dependency with respect to the prior art amplifier 100 noted above. Furthermore, the error amplifier 19, while described herein as being particularly well suited for disk drives, is also well suited for control systems in general, for example, as well as other applications which will be appreciated by those of skill in the art.

A method aspect of the invention is for detecting saturation of an amplifier, such as the error amplifier 19 described above. The method includes defining respective first and second biasing voltages at control terminals of the first and second output transistors 21, 22 using the biasing stage 23. Additionally, the output of the first output transistor 21 is selectively clamped to an upper clamping voltage using a first clamping transistor 27 having a first conduction terminal connected to the control terminal of the first output transistor, a second conduction terminal connected to a reference voltage (e.g., ground), and a control terminal connected to the upper clamping voltage.

Moreover, the output of the second output transistor 22 is selectively clamped to a lower clamping voltage using a second clamping transistor 29 having a first conduction terminal connected to the supply voltage Vs, a second conduction terminal connected to the control terminal of the second output transistor, and a control terminal connected to the lower clamping voltage. The method may also advantageously include providing a saturation signal for at least one of (a) the output of the first output transistor 21 being clamped to the upper clamping voltage, and (b) the output of the second output transistor 22 being clamped to the lower clamping voltage. Further method aspects of the invention will be appreciated by those skilled in the art based upon the foregoing description and will therefore not be discussed further herein.

Additionally, many modifications and other embodiments of the invention will come to the mind of one skilled in the art having the benefit of the teachings presented in the foregoing descriptions and the associated drawings. Therefore, it is understood that the invention is not to be limited to the specific embodiments disclosed, and that modifications and embodiments are intended to be included within the scope of the appended claims.

That which is claimed is:

1. An amplifier comprising:
   an output stage comprising
      a first output transistor having a first conduction terminal connected to a supply voltage, a second conduction terminal, and a control terminal, and
      a second output transistor having a first conduction terminal connected to the second conduction terminal of said first output transistor and defining an output of the amplifier, a second conduction terminal connected to a reference voltage, and a control terminal;
   a biasing stage for generating first and second biasing voltages at the control terminals of said first and second output transistors, respectively, based upon the supply voltage and an input signal of the amplifier;
   a clamping stage comprising
      a first clamping transistor having a first conduction terminal connected to the control terminal of said first output transistor, a second conduction terminal connected to the reference voltage, and a control terminal connected to an upper clamping voltage, said first clamping transistor thus clamping an output of said first output transistor to the upper clamping voltage, and
      a second clamping transistor having a first conduction terminal connected to the supply voltage, a second conduction terminal connected to the control terminal of said second output transistor, and a control terminal connected to a lower clamping voltage, said second clamping transistor thus clamping an output of said second output transistor to the lower clamping voltage; and
   a saturation detector connected to said clamping stage for providing a saturation signal for at least one of the output of said first output transistor being clamped to the upper clamping voltage, and the output of said second output transistor being clamped to the lower clamping voltage.

2. The amplifier of claim 1 wherein said saturation detector comprises:
   a saturation reference current source connected to the supply voltage; and
   a saturation detection transistor having a first conduction terminal connected to said saturation reference current source, a second conduction terminal connected to the second conduction terminal of said first clamping transistor, and a control terminal connected to the first conduction terminal of said second clamping transistor.

3. The amplifier of claim 2 wherein said saturation detector further comprises a first resistor connected between the second conduction terminal of said saturation detection transistor and the reference voltage.

4. The amplifier of claim 2 wherein said saturation detector further comprises a second resistor connected between the supply voltage and the control terminal of said saturation detection transistor.

5. The amplifier of claim 2 wherein said saturation detector provides the saturation signal at the second conduction terminal of said saturation detection transistor.

6. The amplifier of claim 2 wherein all of said first and second output transistors, said first and second clamping transistors, and said saturation detection transistor comprise bipolar junction transistors (BJTs).

7. The amplifier of claim 1 wherein said biasing stage comprises:
   a biasing current source connected to the supply voltage; and
   an input transistor having a first conduction terminal connected to said biasing current source, a second conduction terminal connected to the reference voltage, and a control terminal connected to the input signal of the amplifier.

8. The amplifier of claim 7 wherein said biasing stage further comprises at least one diode connected between said biasing current source and the first conduction terminal of said input transistor.

9. The amplifier of claim 1 wherein said clamping stage further comprises:
   a clamping reference current source connected to the supply voltage; and
   first and second resistors series-connected between said clamping reference current source and the reference voltage, the first clamping voltage being provided between said clamping reference current source and said first resistor, and the second clamping voltage being provided between said first resistor and said second resistor.

10. The amplifier of claim 1 wherein said output stage comprises a class AB output stage.

11. An amplifier comprising:
    an output stage comprising
      a first output transistor having a first conduction terminal connected to a supply voltage, a second conduction terminal, and a control terminal, and
      a second output transistor having a first conduction terminal connected to the second conduction terminal of said first output transistor and defining an output of the amplifier, a second conduction terminal connected to a reference voltage, and a control terminal;
    a biasing stage comprising
      a biasing current source connected to the supply voltage, and
      an input transistor having a first conduction terminal connected to said biasing current source, a second conduction terminal connected to the reference voltage, and a control terminal connected to an input signal of the amplifier, said biasing stage generating first and second biasing voltages at the control terminals of said first and second output transistors, respectively, based upon the supply voltage and the input signal of the amplifier;
    a clamping stage comprising
      a first clamping transistor having a first conduction terminal connected to the control terminal of said first output transistor, a second conduction terminal connected to the reference voltage, and a control terminal connected to an upper clamping voltage, said first clamping transistor thus clamping an output of said first output transistor to the upper clamping voltage, and
      a second clamping transistor having a first conduction terminal connected to the supply voltage, a second conduction terminal connected to the control terminal of said second output transistor, and a control terminal connected to a lower clamping voltage, said second clamping transistor thus clamping an output of said second output transistor to the lower clamping voltage; and
    a saturation detector comprising
      a saturation reference current source connected to the supply voltage, and
      a saturation detection transistor having a first conduction terminal connected to said saturation reference current source, a second conduction terminal connected to the second conduction terminal of said first clamping transistor, and a control terminal connected to the first conduction terminal of said second clamping transistor,
      said saturation detector providing a saturation signal for at least one of the output of said first output transistor being clamped to the upper clamping voltage, and the output of said second output transistor being clamped to the lower clamping voltage.

12. The amplifier of claim 11 wherein said saturation detector further comprises a first resistor connected between the second conduction terminal of said saturation detection transistor and the reference voltage.

13. The amplifier of claim 11 wherein said saturation detector further comprises a second resistor connected between the supply voltage and the control terminal of said saturation detection transistor.

14. The amplifier of claim 11 wherein said saturation detector provides the saturation signal at the second conduction terminal of said saturation detection transistor.

15. The amplifier of claim 11 wherein all of said first and second output transistors, said first and second clamping transistors, and said saturation detection transistor comprise bipolar junction transistors (BJTs).

16. The amplifier of claim 11 wherein said biasing stage further comprises at least one diode connected between said biasing current source and the first conduction terminal of said input transistor.

17. The amplifier of claim 11 wherein said clamping stage further comprises:
    a clamping reference current source connected to the supply voltage; and
    first and second resistors series-connected between said clamping reference current source and the reference voltage, the first clamping voltage being provided between said clamping reference current source and said first resistor, and the second clamping voltage being provided between said first resistor and said second resistor.

18. The amplifier of claim 11 wherein said output stage comprises a class AB output stage.

19. The amplifier of claim 11 wherein said biasing current source and said saturation reference current source generate substantially the same current.

20. A disk drive comprising:
    a data storage disk;
    a head for at least one of reading data from and writing data to said data storage disk;

a motor for positioning said head adjacent said data storage disk;

a driving stage for generating at least one driving current for said motor; and an error amplifier for providing an error signal to said driving stage based upon a reference signal and a feedback signal corresponding to a current in said motor, said error amplifier comprising an output stage comprising a first output transistor having a first conduction terminal connected to a supply voltage, a second conduction terminal, and a control terminal, and a second output transistor having a first conduction terminal connected to the second conduction terminal of said first output transistor and defining an output of the amplifier, a second conduction terminal connected to a reference voltage, and a control terminal, a biasing stage for generating first and second biasing voltages at the control terminals of said first and second output transistors, respectively, based upon the supply voltage and the feedback signal, a clamping stage comprising a first clamping transistor having a first conduction terminal connected to the control terminal of said first output transistor, a second conduction terminal connected to the reference voltage, and a control terminal connected to an upper clamping voltage, said first clamping transistor thus clamping an output of said first output transistor to the upper clamping voltage, and a second clamping transistor having a first conduction terminal connected to the supply voltage, a second conduction terminal connected to the control terminal of said second output transistor, and a control terminal connected to a lower clamping voltage, said second clamping transistor thus clamping an output of said second output transistor to the lower clamping voltage, and a saturation detector connected to said clamping stage for providing a saturation signal for at least one of the output of said first output transistor being clamped to the upper clamping voltage, and the output of said second output transistor being clamped to the lower clamping voltage.

21. The disk drive of claim 20 wherein said saturation detector comprises:

a saturation reference current source connected to the supply voltage; and a saturation detection transistor having a first conduction terminal connected to said saturation reference current source, a second conduction terminal connected to the second conduction terminal of said first clamping transistor, and a control terminal connected to the first conduction terminal of said second clamping transistor.

22. The disk drive of claim 21 wherein said saturation detector further comprises a first resistor connected between the second conduction terminal of said saturation detection transistor and the reference voltage.

23. The disk drive of claim 21 wherein said saturation detector further comprises a second resistor connected between the supply voltage and the control terminal of said saturation detection transistor.

24. The disk drive of claim 21 wherein said saturation detector provides the saturation signal at the second conduction terminal of said saturation detection transistor.

25. The disk drive of claim 21 wherein said first and second output transistors, said first and second clamping transistors, and said saturation detection transistor comprise bipolar junction transistors (BJTs).

26. The disk drive of claim 20 wherein said biasing stage comprises:

a biasing current source connected to the supply voltage; and an input transistor having a first conduction terminal connected to said biasing current source, a second conduction terminal connected to the reference voltage, and a control terminal connected to the input signal of the amplifier.

27. The disk drive of claim 26 wherein said biasing stage further comprises at least one diode connected between said biasing current source and the first conduction terminal of said input transistor.

28. The disk drive of claim 20 wherein said clamping stage further comprises:

a clamping reference current source connected to the supply voltage; and first and second resistors series-connected between said clamping reference current source and the reference voltage, the first clamping voltage being provided between said clamping reference current source and said first resistor, and the second clamping voltage being provided between said first resistor and said second resistor.

29. The disk drive of claim 20 wherein said motor comprises a voice coil motor.

30. A method for detecting saturation of an amplifier comprising an output stage comprising first and second output transistors series connected between a supply voltage and a voltage reference, and a biasing stage connected to the output stage and to the supply voltage and an input of the amplifier, the method comprising:

defining respective first and second biasing voltages at control terminals of the first and second output transistors using the biasing stage;

selectively clamping an output of the first output transistor to an upper clamping voltage using a first clamping transistor having a first conduction terminal connected to the control terminal of the first output transistor, a second conduction terminal connected to the reference voltage, and a conduction terminal connected to the upper clamping voltage;

selectively clamping an output of the second output transistor to a lower clamping voltage using a second clamping transistor having a first conduction terminal connected to the supply voltage, a second conduction terminal connected to the control terminal of the second output transistor, and a conduction terminal connected to the lower clamping voltage; and providing a saturation signal for at least one of the output of the first output transistor being clamped to the upper clamping voltage, and the output of the second output transistor being clamped to the lower clamping voltage.

31. The method of claim 30 wherein providing the saturation signal comprises:

connecting a saturation reference current source to the supply voltage; and connecting a first conduction terminal of a saturation detection transistor to the saturation reference current source, a second conduction terminal of the saturation detection transistor to the second conduction terminal of the first clamping transistor, and a control terminal of the saturation detection transistor to the first conduction terminal of the second clamping transistor.

32. The method of claim 31 wherein providing the saturation signal further comprises connecting a first resistor between the second conduction terminal of the saturation detection transistor and the reference voltage.

33. The method of claim 31 wherein providing the saturation signal further comprises connecting a second resistor between the supply voltage and the control terminal of the saturation detection transistor.

34. The method of claim 31 wherein providing the saturation signal further comprises providing the saturation signal at the second conduction terminal of the saturation detection transistor.

* * * * *